United States Patent
Fricero et al.

(10) Patent No.: US 10,311,164 B2
(45) Date of Patent: Jun. 4, 2019

(54) METHOD FOR OPTIMIZING THE TOLERANCING OF A SET OF FLEXIBLE PARTS SUBJECTED TO FORCES

(71) Applicants: EUROPEAN AERONAUTIC DEFENCE AND SPACE COMPANY EADS FRANCE, Paris (FR); ECOLE NORMALE SUPERIEURE DE CACHAN, Cachan (FR)

(72) Inventors: Benoit Fricero, Marly le Roi (FR); Francois Thiebaut, Forges les Bains (FR); Alain Stricher, Saint-Die (FR); Laurent Champaney, Malakoff (FR)

(73) Assignees: AIRBUS, Blagnac (FR); ECOLE NORMALE SUPERIEURE DE CACHAN, Cachan (FR)

( * ) Notice: Subject to any disclaimer, the term of this patent is extended or adjusted under 35 U.S.C. 154(b) by 789 days.

(21) Appl. No.: 14/350,067

(22) PCT Filed: Oct. 4, 2012

(86) PCT No.: PCT/EP2012/069583
§ 371 (c)(1),
(2) Date: Apr. 4, 2014

(87) PCT Pub. No.: WO2013/050444
PCT Pub. Date: Apr. 11, 2013

(65) Prior Publication Data
US 2014/0288895 A1    Sep. 25, 2014

(30) Foreign Application Priority Data
Oct. 8, 2011    (FR) ..................... 11 59095

(51) Int. Cl.
*B64C 1/00*    (2006.01)
*B64F 5/10*    (2017.01)
(Continued)

(52) U.S. Cl.
CPC .............. *G06F 17/50* (2013.01); *B64C 1/069* (2013.01); *B64F 5/10* (2017.01); *G05B 19/4097* (2013.01);
(Continued)

(58) Field of Classification Search
CPC . G06F 17/50; B64F 5/10; B64C 1/069; B64C 2001/0081; B64C 2001/0072;
(Continued)

(56) References Cited

FOREIGN PATENT DOCUMENTS

| FR | 2940375 A1 | 6/2010 |
|----|------------|--------|
| WO | 9701802 A1 | 1/1997 |

OTHER PUBLICATIONS

Pasquale Franciosa, Modeling and Simulation of Variational Rigid and Compliant Assembly for Tolerance Analysis, 2009, Diss. University of Naples Federico II, pp. I-199.*

(Continued)

*Primary Examiner* — Juan C Ochoa
(74) *Attorney, Agent, or Firm* — Im IP Law; C. Andrew Im; Chai Im

(57) ABSTRACT

A method for optimizing the tolerancing of a set of flexible parts subjected to forces. At the design phase, an optimum tolerancing for flexible parts is defined according to the assembly process plan and the desired functional requirements. The structural digital models are considered as parts to be assembled and composed of a plurality of assembly points, a plurality of structural points, and mathematical relations or mechanical stiffness, such as a non-null relative displacement of a structural/assembly point in relation to the other structural/assembly points in a single digital model, modify tensor in each structural/assembly point. From a mechanical point of view, these mathematical relations express the existence of an elastic recovery property between the points that make up the digital model. The issue (Continued)

of optimization is simplified by: the definition of influence factors; the simulation of parts deviating from the nominal by a distortion vector.

9 Claims, 3 Drawing Sheets

(51) Int. Cl.
  *B64C 1/06* (2006.01)
  *G05B 19/4097* (2006.01)
  *G06F 17/50* (2006.01)

(52) U.S. Cl.
  CPC ............... *B64C 2001/0072* (2013.01); *B64C 2001/0081* (2013.01); *G05B 2219/31068* (2013.01); *G05B 2219/35017* (2013.01); *G05B 2219/35117* (2013.01); *G05B 2219/35223* (2013.01); *G05B 2219/45055* (2013.01); *Y02P 90/04* (2015.11); *Y02P 90/265* (2015.11); *Y02T 50/43* (2013.01)

(58) Field of Classification Search
  CPC ...... G05B 19/4097; G05B 2219/35223; G05B 2219/45055; G05B 2219/35117; G05B 2219/31068; G05B 2219/35017; Y02P 90/265; Y02P 90/04; Y02T 50/433; Y02T 50/43
  USPC .................................................... 703/1, 2, 8
  See application file for complete search history.

(56) References Cited

OTHER PUBLICATIONS

Seber and Sakarya, Nonlinear modeling and aeroelastic analysis of an adaptive camber wing, 2010, Journal of Aircraft 47.6, pp. 2067-2074.*
Gerhart I. Schuëller, A state-of-the-art report on computational stochastic mechanics, 1997, Probabilistic Engineering Mechanics 12.4 , pp. 197-321.*
Alain Stricher et al., "Flexible tolerancing: A first step towards the use of nonlinear simulation of assembly", ICCES, vol. 14, No. 4, Jan. 1, 2010, pp. 113-114.
R. Soderberg et al., "Improving decision making by simulating and visualizing geometrical variation in non-rigid assemblies", CIRP Annuals—Manufacturing Technology, vol. 57, No. 1, Jan. 1, 2008, pp. 175-178.

* cited by examiner

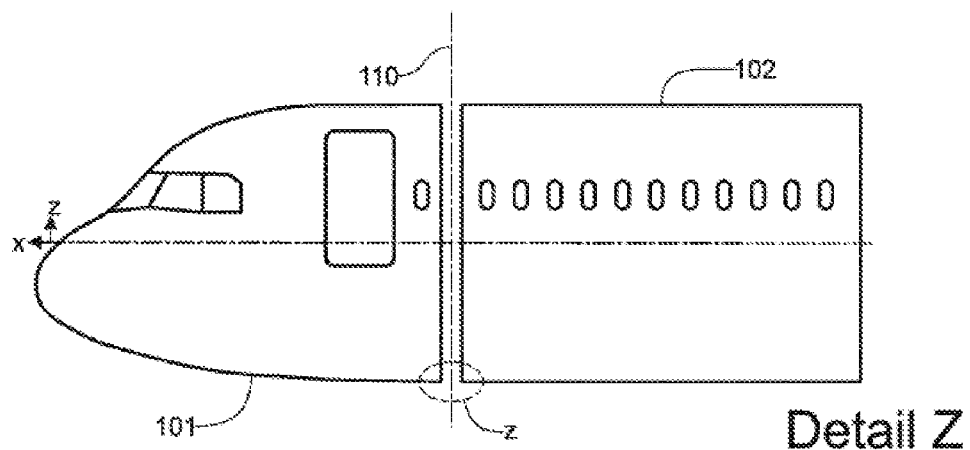
Fig. 1
Detail Z
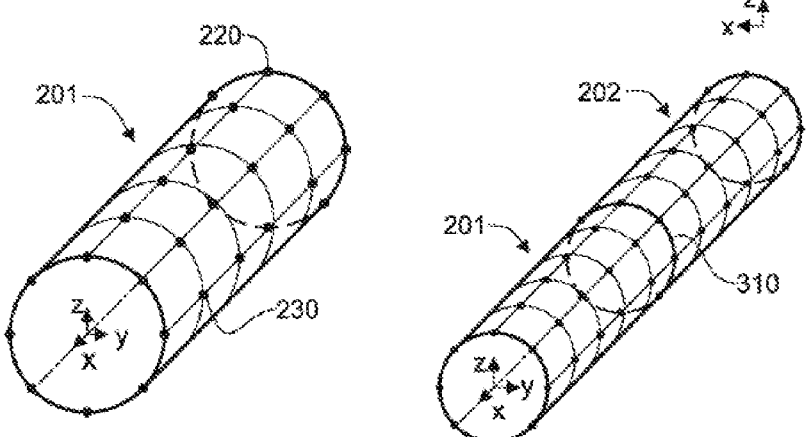
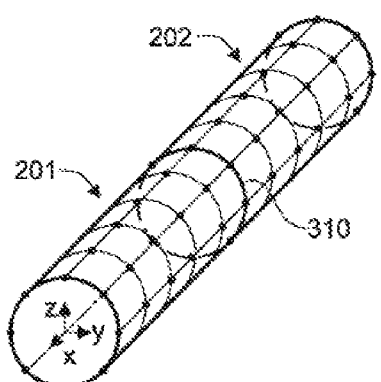
Fig. 2    Fig. 3
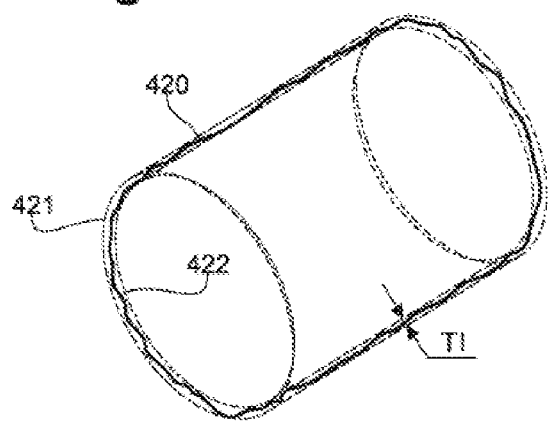
Fig. 4

METHOD FOR OPTIMIZING THE TOLERANCING OF A SET OF FLEXIBLE PARTS SUBJECTED TO FORCES

RELATED APPLICATIONS

This application is a § 371 application from PCT/EP2012/069583 filed Oct. 4, 2012, which claims priority from French Patent Application No. 11 59095 filed Oct. 8, 2011, each of which is herein incorporated by reference in its entirety.

TECHNICAL FIELD OF THE INVENTION

The invention relates to a method for optimizing the tolerancing of a set of mechanically flexible parts, in particular subjected to loads. The invention is more particularly suited to the checking and optimization of the tolerancing of parts whose deformation under the action of said loads is of the same order of magnitude as the manufacturing or assembly tolerance interval of said parts.

The method which is the subject of the invention is more particularly, but not exclusively, suited to the checking and optimization of the tolerancing of large-size parts having to be assembled according to tight adjustment and positioning constraints, as is the case for aircraft structure elements.

BACKGROUND OF THE INVENTION

It is known from the prior art, in particular from the document FR-A-2940375, to compute an optimum positioning of a part with respect to another part with which it must be assembled as a function of the effective defects measured over a plurality of points belonging to each of said parts at the level of the assembly interface. This optimization method allows the assembly of said parts in compliance with the functional requirements, starting from "post facto" measurements carried out on the real parts and relating to points situated at the interface. Said method makes it possible to find an assembly solution, that is to say a relative positioning of the parts with respect to one another and an assembly range, including in cases where all or some of points measured at the interface of one or the other part lies outside the manufacturing tolerances. The existence of such situations shows that in a good number of cases of assembly, in particular those which implement flexible large-size parts, the manufacturing tolerances imposed during the steps preceding assembly are not suitable:

said tolerances are too restricted, this giving rise to a manufacturing cost overhead with regard to the necessary actual need;

said tolerances are too wide, this giving rise to a cost overhead during assembly.

OBJECT AND SUMMARY OF THE INVENTION

To resolve these drawbacks of the prior art, the invention proposes a method for the determination of an optimal tolerance interval for the production of a first part having to be assembled with a second part according to interface surfaces and in compliance with an assembly functional requirement, said parts being represented by their structural digital mockups, said method comprising the steps consisting in:

a. acquiring the nominal theoretical position of a plurality of so-called assembly points on the interface surfaces of the digital mockups of the first and of the second part;

b. acquiring the nominal theoretical position of a plurality of so-called structure points distributed over the surfaces of the digital mockup of the first and of the second part;

c. acquiring for the pluralities of assembly points and structure points of the digital mockups of the first and of the second part a mechanical restoring stiffness for return to its initial position in the form of a rigidity matrix;

d. acquiring the definition of a variable, called the variable of interest, comprising a scalar variable representative of the assembly functional requirement and a cost function giving the value of the variable of interest as a function of the discrepancy of the scalar variable with respect to the nominal of the assembly functional requirement;

e. acquiring a set of distortion vectors of the digital mockups of the first and of the second part, said vectors being normal to the surfaces of said mockups;

f. computing influence coefficients linearly relating each distortion vector to the value of the variable of interest when the digital mockup of a part, distorted by such a vector, is assembled with the digital mockup of the other nominal theoretical part, the assembly being simulated by placing the assembly points of the two digital mockups in coincidence.

The assembly computation engine is that presented in the document FR-A-2940375. Thus, the implementation of this method makes it possible to determine an optimal manufacturing tolerance for the parts, whilst these exist only at the digital mockup stage, as a function of the functional requirements associated with an assembly, while taking account of the mechanical flexibility of the parts present. Unlike the solutions known from the prior art, where the assembly method is determined as a function of the quality of production of the parts present, by measurements carried out on said parts, the method which is the subject of the invention fixes the manufacturing tolerances of the parts in an optimal manner so as to, jointly, maximize the expectation of the existence of an assembly solution for the parts and to maximize the manufacturing tolerances for the assembled parts, therefore to reduce their manufacturing cost. The cost function can be of any form.

Throughout the present text, the terms "coincidence" and "placed in coincidence" refer to an attempt to bring mutually related points closer together spatially. Coincidence is not necessarily achieved on completion of this operation and the points may remain separated from one another, or indeed, in certain undesirable situations which, however, are possible from the point of view of the simulation, lead to interpenetration of the profiles thus placed in coincidence.

The optimization problem is simplified through:
the definition of influence coefficients;
the simulation of the parts deviating from the nominal by a distortion vector.

Such a distortion vector is defined by its components and its point of application on the part, it is normal to the surface of the part and acts like a small displacement imposed at this point, which small displacement produces a deflection profile of the continuous medium simulated by the digital mockup of the part. The identification of a restricted linear model makes it possible to conduct the optimization in a manner that is sparing in its consumption of computational resources while taking account of a significant number of variation configurations and while ensuring the convergence of the computation.

The invention can be implemented according to the advantageous embodiments set forth hereinafter which can be considered individually or according to any technically operative combination.

Advantageously the combinations of distortion vectors reproduce the natural modes of transverse vibrations of the part. Thus, the deflection profiles are always mechanically allowable, including in their combinations.

According to a first enhancement of the method which is the subject of the invention, suited to the case where the assembly points of the two digital mockups exhibit discrepancies tangential to the assembly surfaces, it comprises after step f) a step consisting in:

g. updating the rigidity matrix of the digital mockups deformed during the simulation of the assembly.

Thus this embodiment makes it possible to process the cases of skewing of the assembly points and makes it possible in particular to optimize the tolerancing of the parts with a view to so-called mecano assembly and/or to verify the feasibility of such an assembly. A mecano assembly is a mode of assembly in which the bores in particular intended to receive the fixings necessary for the assembly of the parts are pre-drilled on said parts before the latter are placed in coincidence.

According to a second advantageous enhancement, of the method which is the subject of the invention, suited to the case where an assembly range must be complied with, between steps e) and f) said method comprises steps consisting in:

h. acquiring an assembly range for the digital mockups;
i. generating a plurality of first and second digital mockups distorted by combinations of distortion vectors defined in step e);
j. carrying out the assemblies of the various digital mockups thus generated according to the assembly range;
k. determining for each case of assembly thus carried out the influence variable;

the computation of the influence coefficients of step f) being carried out by a so-called Monte Carlo method, on the basis of the results of step k).

Thus, this embodiment makes it possible to process all cases of assembly, including the most complex, by replacing the analytical computation of the influence coefficients by a statistical computation of the latter, so as to thus retrieve a linear formulation of the optimization problem.

Advantageously, between steps e) and f), the method which is the subject of the invention comprises steps consisting in:

l. acquiring an initial positioning system and an initial stressing system for the digital mockups;
m. computing the displacement, from their initial position, of the assembly points and of the structure points of the digital mockup in its initial positioning system and subjected to its initial stressing system.

Thus, according to this advantageous embodiment, the method which is the subject of the invention makes it possible to take into account, at the digital mockup stage, the real nature of the devices for placing the part in position in the course of its assembly, these positioning devices possibly having an influence on the deformation of said part.

According to an enhancement of the latter embodiment, the method which is the subject of the invention comprises, subsequent to step f), a step consisting in:

n. modifying the initial positioning system or the initial loading system of step l) and repeating step f) with these new initial conditions.

Thus, the method which is the subject of the invention makes it possible to optimize the choice of the positioning devices and the assembly tools as a function, in particular, of the mechanical flexibility of the parts present, and of the optimal production tolerance for said parts in compliance with the functional requirements.

Advantageously, the method which is the subject of the invention comprises, according to its second enhancement, subsequent to step f), a step consisting in:

o. modifying the assembly range and redoing step j).

Thus, the method makes it possible not only to optimize the tolerancing of the parts but also to optimize the assembly range so as to find the most favorable tolerancing and assembly range pair.

The method which is the subject of the invention is advantageously carried out when the structure points and the assembly points of the first part are nodes of a mesh and when the stiffness is computed by a finite element model using said mesh. Thus it is possible to implement the method by way of a deflection profile computation based on finite differences or finite elements.

According to the most commonplace embodiment, the initial stressing system is gravity.

BRIEF DESCRIPTION OF THE DRAWINGS

The invention is described hereinafter according to its wholly nonlimiting preferred embodiments and by FIGS. 1 to 7 in which:

FIG. 1 schematically represents in profile an exemplary assembly of two aircraft sections;

FIG. 2 represents according to a perspective view from above and end-on an exemplary geometric representation of a behavior model of an aircraft section used to implement the method which is the subject of the invention according to one of its embodiments;

FIG. 3 represents according to the same view as FIG. 2 the geometric representation of two digital mockups of an aircraft section in the course of the implementation of the method which is the subject of the invention;

FIG. 4 represents in perspective according to a profile view the demarcation of the contour of a digital mockup of an aircraft section included in contour tolerance limits Tl;

DETAILED DESCRIPTION OF THE EMBODIMENTS

Figure 5:
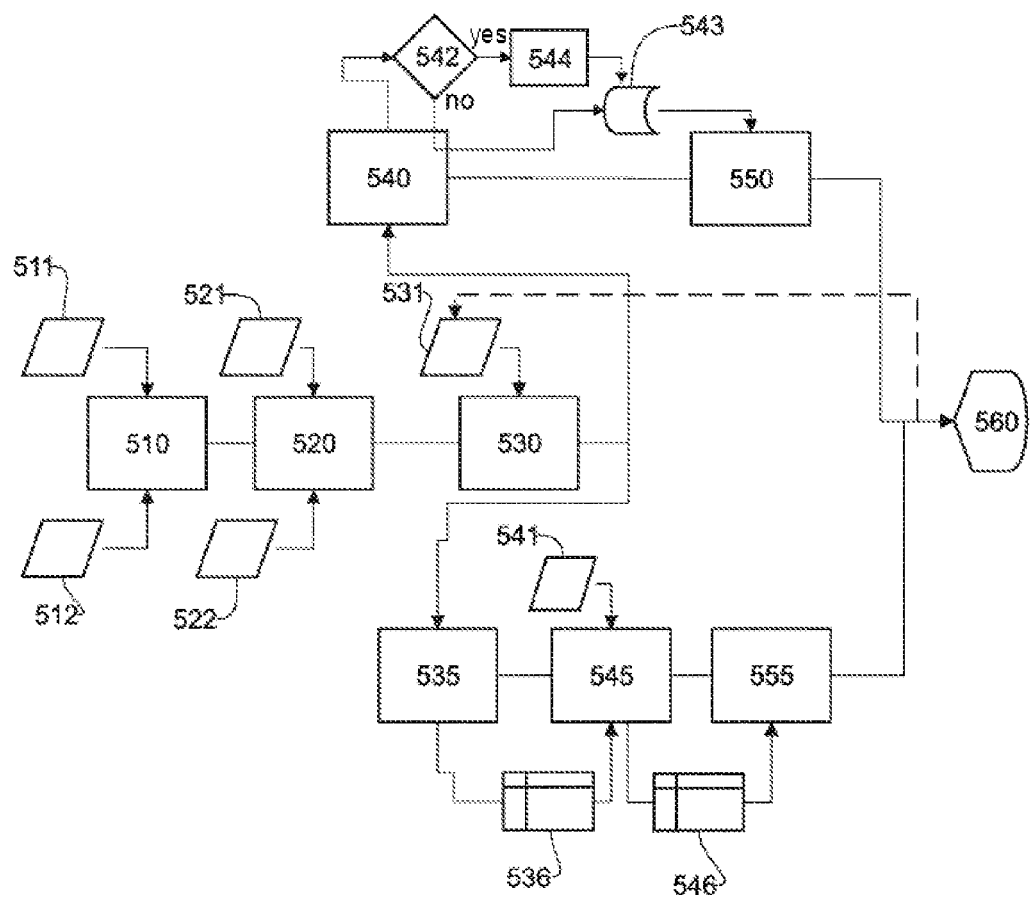
FIG. 5 shows a logic diagram of an embodiment of the method which is the subject of the invention.

FIG. 1, according to an exemplary embodiment, the method which is the subject of the invention can be applied to the optimization of the tolerancing of the sections of an aircraft with a view to their assembly. The fuselage of an aircraft, here an airplane, consists of sections (101, 102) whose shape can be regarded as substantially cylindrical without this constituting a limitation, and extending along a so-called longitudinal "x" axis. The juxtaposition along this longitudinal axis and the assembly of said sections makes it possible to build the fuselage of the aircraft. According to this exemplary embodiment, corresponding to a mediumhaul single-aisle airplane, the diameter of the sections at the level of the assembly interface (110) is of the order of four meters. The sections consist, for example, of an assembly of stiffened panels, comprising a metallic or composite material skin whose thickness customarily lies between 2 mm and 5 mm, rigidified by longitudinal stiffeners, parallel to the x axis, customarily referred to as stringers, and circumferential stiffeners, or frames extending according to the perimeter of the fuselage in a section transverse to the longitudinal axis. The stringers are customarily distributed according to a circumferential spacing of between 150 mm and 200 mm and the frames, distributed according to a longitudinal spacing of between 500 mm and 1 m. Having regard to the dimensions of the section and its construction, said section exhibits a certain flexibility, which, under the effect of the section's own weight, can lead locally to deformations of the section of an order of magnitude of between $1/1000^{th}$ and $1/10000^{th}$ of its exterior dimensions. In this exemplary application of the method, the local flexibility of the section is of the order of a millimeter.

Detail Z, the sections must be assembled in compliance with functional constraints or requirements, in particular geometric, which form the subject of a tolerancing. By way of nonlimiting example, such a constraint may concern the radial flushness a of the sections thus assembled. According to this example, the flushness is perfect when the condition a=0 is satisfied over the whole of the perimeter of assembly. When a differs from 0, then this lack of flushness generates additional aerodynamic drag when the aircraft is in flight, which aerodynamic drag leads to increased fuel consumption, so that to avoid these adverse effects, the value of a must be contained in a tolerance span generally of the order of a millimeter. A geometric constraint such as a is customarily dubbed a "condition dimension" according to the prior art. Compliance with this condition dimension is the result of a chain of dimensions, that is to say a vector sum of characteristic dimensions of the assembled parts. Within the framework of mass manufacture, each of these dimensions is subject to some spread or variability which is caused by the variability of the means for manufacturing the elementary parts constituting the sections, and to variability of compliance with the condition dimensions in the course of the successive assemblies of these elementary parts culminating in the assembly envisaged.

Production variability is taken into account by assigning each of the dimensions of the chain a tolerance interval representing the allowable span of spread of said dimension. According to the prior art, to ensure compliance with the condition dimension whatever the assembled sections and whatever the elementary parts constituting these sections, it is necessary that the tolerance span of the condition dimension be wider than the sum of the amplitudes of the tolerance intervals of the dimensions of the chain defining said condition dimension. If this equation is complied with, then any first section (101) can be assembled with any second section (102) in compliance with the condition dimension. In the case of the assembly of aircraft sections, the latter consist of several thousand parts. The condition dimension a of this example being of the order of a millimeter, the allowable manufacturing tolerances of the parts and sub-units constituting said section ought to be of the order of a micrometer ($10^{-6}$ meters), this being unachievable. With this impossibility of interchangeability, the assemblies can however be achieved in compliance with the condition dimensions but then require a matching of the parts. That is to say that each first section (101) is able to be assembled with a limited number of second sections (102) with which compliance with the condition dimension or constraint will be ensured. This industrially used method, usually for elementary parts, inevitably leads to scrap, certain parts being unable to be assembled with any other. Moreover this method requires a stock of parts of each category, to obtain a sufficient statistical expectation that each part can be associated with another, and it is therefore poorly compatible with just-in-time production methods.

Specifically, in the presence of large-size parts, such as aircraft sections, the latter are placed for their assembly on tools having a possibility of orientation in space of said sections. Thus, for a given pair of sections, there is undertaken an adjustment of their relative orientations after they have been measured, these relative orientations being optimal for placing the various condition dimensions, or constraints, in their tolerance interval. This first approach makes it possible to find a satisfactory solution for assembling two sections in a large majority of cases. However, it gives rise, on the other hand, to an additional cycle time corresponding to the relative measurement and orientation time for the sections. Now, the sections exhibiting a certain flexibility, they deform in a substantially different manner as a function of their orientation in space, so that the theoretical relative positioning may require fine tunings to take account of these deformations. The method described in patent application FR-A-2940375 affords an optimal response to this situation. This method of the prior art makes it possible to find an optimal assembly solution in a fixed concrete situation, where two physical sections exhibiting their manufacturing defects are present. Even if in numerous cases the assembly solution is found by this method of the prior art, nothing makes it possible to ensure that such a solution can actually be determined before implementing the method. On the contrary, insofar as an assembly solution can be determined in almost all of the assemblies, the question arises of knowing whether it had been possible to permit wider manufacturing tolerances for the sections, which would have a very favorable effect on their manufacturing cost. The question may also be raised of knowing whether it had been possible to widen the manufacturing tolerance for certain parts or sub-units and to reduce the manufacturing tolerance for other sub-units so as to culminate, at one and the same time, in a higher statistical expectation of assembly in compliance with the functional requirements and in a reduction in manufacturing costs. Now, these tolerancings cannot be adjusted during assembly, the sections having already been manufactured, but are fixed during the design.

The method which is the subject of the invention is aimed at responding to these questions, including at the initial stage of the design, where the elementary parts and sub-units constituting the sections, or in a more general manner the parts to be assembled, do not exist physically and cannot be measured.

FIG. 2 and FIG. 3, the method which is the subject of the invention considers the structural digital mockups (201, 202) of the sections to be assembled. Said structural digital mockups (201, 202) consist of the following information:
 a plurality of so-called assembly points (220);
 a plurality of so-called structure points (230);
 so-called mechanical stiffness mathematical relations, such that a non-zero relative displacement of a structure point (230) or assembly point (220) with respect to the other structure points or assembly points of one and the same digital mockup modifies a tensor at each of these points. From a mechanical point of view these mathematical relations express the existence of an elastic restoring force between the points (220, 230) constituting the digital mockup (201, 202). The qualifier "structural" refers to the taking of this flexibility into account.

The assembly points and structure points are defined by their position in a reference frame (x,y,z) tied to the mockup of the section (201, 202) considered. The assembly points and structure points do not differ in their nature at the level of the mockup. The qualification "assembly" or "structure" is determined by the implementation of the method. Indeed, FIG. 3, the so-called assembly points (220) are placed in coincidence pair-wise, one point belonging to the first (201) digital mockup and the other point to the second (202) digital mockup thus assembled. Thus, the assembly operation, within the meaning of the method which is the subject of the invention, consists in applying to the set of assembly points, situated on the assembly interface (310), of one and/or the other digital mockup thus assembled, a displacement wrench so as to place the assembly points (210), pair-wise associated, in coincidence.

According to the prior art assembly simulation or optimization methods such as described in document FR-A-2940375, assembly is simulated by placing the assembly points in coincidence and this placing in coincidence considers only displacements normal to the assembly surface of the assembly points, on the one hand, and without management of the contacts, on the other hand. Thus the prior art assembly simulation method, by taking just the normal displacements into account, does not make it possible to anticipate an assembly exhibiting skewing of the assembly points, as may be found in the case of so-called mecano assembly, and on the other hand, through the non-management of the contacts, does not make it possible to simulate an assembly range, that is to say ordered sequences of placing in coincidence and of fixing of the assembly points of the two digital mockups, the thus previously assembled points influencing the mechanical behavior of the parts during subsequent assembly of the points. Thus, by starting from the method for simulating assembly described in the document FR-A-2940375, the carrying out of a method for optimizing the tolerancing of flexible parts involves the resolving of several technical problems according to the fineness of resolution sought and the complexity of the assembly operation studied. These essential technical problems are four in number:

defining an optimization engine on the basis of simulated parts;
generating digital mockups representative of the production variability of the parts;
integrating the influence of the tangential defects of positioning of the assembly points at the assembly interface;
integrating the influence of the contacts to take the assembly ranges into account.

The first technical problem is resolved by defining and by computing coefficients of influence between the defects of the parts, that is to say digital mockups and the achieving of the condition dimensions. The optimization problem is thus reduced to a linear problem.

The second of these technical problems consists in defining distortions of the digital mockups which are mechanically allowable; this problem is resolved by calling upon distortion vectors, for example representative of the transverse vibration modes of the parts present, and which may be superimposed, the influence coefficients being computed with respect to these distortion vectors. The third technical problem is resolved by using an update of the rigidity matrix of the digital mockups and the fourth technical problem is resolved according to the invention by computing the influence coefficients by a statistical approach.

According to a preferred embodiment, the digital mockups are finite element models of the parts (201, 202) to be assembled.

FIG. 4, the contour (420) of each assembly digital mockup lies between two contours (421, 422) parallel to the nominal contour of the mockup and remote from the tolerance interval Tl. In the case of cylindrical sections this tolerance span is delimited by two coaxial cylinders centered on the cylinder corresponding to the nominal section.

FIG. 5, according to an exemplary embodiment, the method which is the subject of the invention consists in acquiring in the course of a first initialization step (510) a set of structure (230) points and assembly (220) points Pi of a first section (201). This acquisition consists in obtaining a data file (511) associating for each point Pi of the digital mockup a triplet $(x_i, y_i, z_i)$ corresponding to its theoretical coordinates in a reference frame (x,y,z) tied to said digital mockup. By "theoretical coordinates" should be understood this point's position such as it is envisaged if the part to which it belongs is achieved perfectly, that is to say if all these manufacturing dimensions are achieved at their nominal value. In the course of this same initialization step, a file (512) comprising stiffness coefficients associated with the various points is also acquired. These stiffness coefficients are dependent on the constituent materials of the part.

In the course of a construction step (520) a finite element model of the part is constructed on the basis of the data acquired in the course of the initialization step (510). In this model, the points Pi constitute the nodes of a mesh, the stiffness coefficients constitute a stiffness matrix [K] associated with this mesh.

With this mechanical modeling of the part are associated boundary conditions (521) and an initial loading (522). These conditions (521, 522) make it possible to represent the environment of assembly of the parts, in particular the assembly mountings and a stress field such as gravity. The boundary conditions are expressed at each of the nodes of interest of the mesh and conventionally consist in preventing motions of these nodes, in imposing a displacement or in defining an exterior restoring force for returning this node when the latter departs from a given position. The stress field, described by a file (522) defining a load vector, is applied to the finite element model of the part with its boundary conditions, and will therefore lead to an elastic deformation of the latter, that is to say a displacement of the nodes causing interior forces and exterior forces at the level of the nodes subjected to boundary conditions. Thus, the method which is the subject of the invention makes it possible to take account in particular of the orientation of the parts during assembly and of the influence of this orientation when the part is subjected in particular to gravity, and to differentiate, for example, assembly where the x axis of the parts is oriented horizontally and assembly where the x axis of the assembled parts is oriented vertically.

Prior to assembly, a step of distorting the mesh (530) is carried out. For this purpose, the parts are deformed by imposing a displacement of the nodes constituting the model according to a generalized displacement vector {U}. For this purpose, the distortion step (530) receives data (531) on said displacement vector as input.

Figure 6:
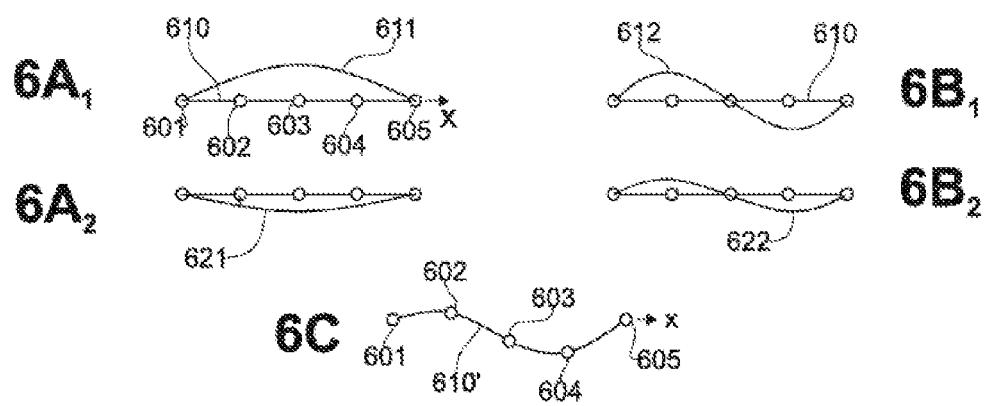
FIG. 6 is an example illustrating the principle of distorting the mesh of a part with a view to simulating manufacturing defects in the shape of the latter, illustrated in the case of a part of beam type.

FIG. 6, the principle of distortion is explained in the case of a straight beam to simplify the representation thereof. According to this exemplary embodiment, the defect u at each point is determined by a unitary discrepancy field $v_n$ dependent on the spatial position of the point considered, that is to say its x coordinate in the simplified example of FIG. 6. Several fields $v_n$ can be superimposed, each of the fields being able to be amplified by a factor $\delta_n$.

Thus the displacement of the points is determined by the equation:

$$u(x) = \sum_{n=1}^{N} v_n(x) \cdot \delta_n$$

Thus, FIG. 6A starting from an initially rectilinear part (610) modeled by beam elements comprising 5 nodes (601, 602, 603, 604, 605), a first displacement field (611) of the points leading to a first type of distortion is applied, FIG. 6A$_1$, and amplified (621) by a factor $\delta_1$, FIG. 6A$_2$. FIG. 6B, a second displacement field (612) of the points leading to a second type of distortion is applied, FIG. 6B$_1$, and amplified (622) by a factor $\delta_2$, FIG. 6B$_2$. The two displacement fields are added together, FIG. 6C, thus defining a displacement vector Ui at each point (601, 602, 603, 604, 605) of the mesh, which displacement vector defines the new coordinates of the nodes of the new mesh of the part (610'), corresponding to the shape of the part whose assembly with the other part will be simulated. Thus, according to this exemplary embodiment the end points (601, 605) are displaced by a vector of zero length. The other points (602, 603, 604) are displaced by a vector perpendicular to the x axis resulting from the sum of the amplified unitary displacement fields. According to a more complex exemplary displacement, applicable in particular to three-dimensional models of shell type, the displacement vectors at the nodes extend along the three dimensions of space normally to the surface.

Figure 7:
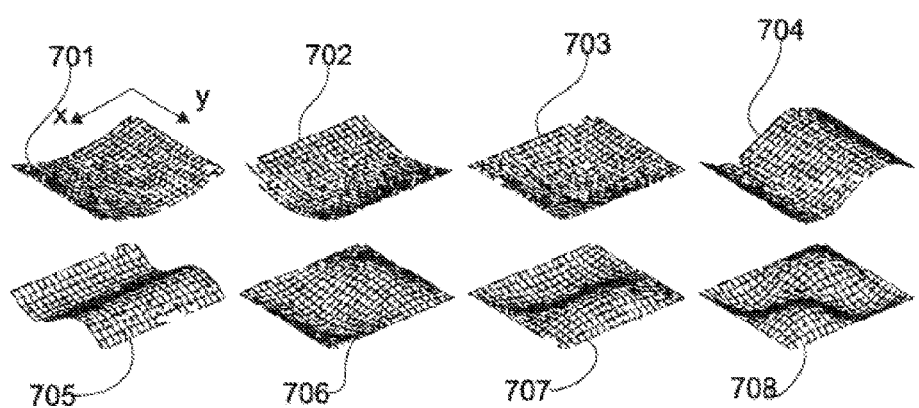
FIG. 7 illustrates various cases of deflection profiles that can be aggregated to generate parts of shell type simulating the presence of manufacturing defects.

FIG. 7 illustrates an exemplary application of this method in the case of a shell model and represents 8 types of combinable distortions (701, 702, 703, 704, 705, 706, 707, 708), according to an exemplary embodiment of the method which is the subject of the invention.

The distortion state of the mockup may be defined by the sum of the effects of various displacement vectors Ui characterized by their projections on the axes (x,y,z) and their point of application. Advantageously these distortion modes correspond to the transverse vibration modes of the part.

The displacements of the nodes caused by the vectors Ui remain compatible with the small displacements assumption and they do not modify the rigidity of the part, that is to say they do not modify the stiffness matrix [K] of the model associated with said part when the assembly points and structure points are in their nominal position, or coordinates.

According to this first embodiment the assembly step (540) consists in placing in coincidence the assembly points of two finite element models representing respectively each of the assembled parts in their environment, that is to say subjected to their boundary conditions and to the stress field, but without taking account of the assembly range or of the contact phenomena at the interfaces. This first embodiment makes it possible to remain within the linearity assumptions, but also to retain the stiffness matrix as defined previously which still remains equivalent to the stiffness matrix [K] of the undeformed digital mockup. Therefore, according to this embodiment the problem is considerably reduced. This embodiment is useful in particular as a first approximation or first optimization, and allows a very fast optimization computation.

The assembly operation (540) consists in imposing a displacement Vi at each of the assembly points of one and/or the other part so as to place said assembly points in coincidence.

The set of displacements Vi applied at each assembly point is represented by a generalized assembly vector {V}.

The loads Fi generated at the assembly points Pi are expressed by the linear relation {F}=[K]{V} where [K] is the stiffness matrix.

The identification step (550) consists in determining influence coefficients making it possible to relate the loads at each of the assembly points and the displacement of the nodes corresponding to these assembly points to the initial displacement, or distortion vector {U} applied during the distortion step (530) and to establish relations of the type:

{F}=[C]{U}; and

{V}=[D]{U}

Thus the force Fi generated at the assembly point Pi can be expressed as a function of the initial defect {U} imposed by an expression of the form $F_{ix} = C_{U/Fix} \times U$ $F_{iy} = C_{U/Fiy} \times U$ $F_{iz} = C_{U/Fiz} \times U$ and in a similar manner, the displacement in the course of the operation of assembly of an assembly point Pj is expressed by $V_{jx} = D_{Un/Vjx} \times U_n$ $V_{jy} = D_{Un/Vjy} \times U_n$ $V_{jz} = D_{Un/Vjz} \times U_n$ These influence coefficients thus define a linear model (543) linking the initial defects of the parts, defects represented by the generalized displacement vector {U}, to the loads {F} and to the displacements {V} necessary for carrying out the assembly.

The determination of these influence coefficients makes it possible to considerably reduce the problem since it makes it possible to compute the assembly loads and the displacement of the assembly points of the digital mockup for any initial discrepancy or defect, but remaining within the small displacements and small deformations assumption. In a way, the overall behavior of the section in the course of assembly is reduced to its effects at the level of the interface, in the form of equations of linear formulation which lend themselves particularly well to an optimization approach. This casting into the form of a linear equation and the reducing of the problem to the phenomena at the interface make it possible to study and to optimize or to pre-optimize the manufacturing tolerances on the set of parts of a complex assembly while reducing the problem at each iteration to the influence coefficients at the assembly interfaces. Thus, it is in particular possible to study the propagation of the defects in tandem with the simulation of the various assemblies. This reduction of the problem makes it possible to carry out this optimization by means of customarily available computational resources and in reasonable computation times. In the absence of this reduction, the complexity of the problem increases in an exponential manner at each iteration and rapidly becomes out of reach of the computational resources available from a practical point of view.

The optimization (550) is carried out on the basis of the linear model (543) by comparing the norms of the displacement vector ||V|| and force vector ||F|| with constraints expressed in scalar form Fmax and Vmax while seeking to maximize the norm $\|U\|$ of the displacement vector used to carry out the distortion of the part in the course of said distortion step (530). The value of $\|U\|$ can be weighted by a cost function. The value of $\|U\|$ thus determined is displayed during a display step (560); it can then be used as Tl for the practical production of the parts.

However, this linear optimization method exhibits limitations. Indeed, a first limitation occurs when the placing of the assembly points in coincidence requires a displacement of these points tangentially to the assembly surfaces. The rigidity of the structures in this direction of stressing entails particularly significant loads, and the strains that these loads set up in the structure modify the behavior of said structure. The applicant has been able to demonstrate that, under these conditions, it was always possible for the linear computation principle set forth previously to be applied on condition that the stiffness matrices of the structural digital mockups are updated after assembly. This updating is intrinsically carried out by taking account of the deformed mesh instead of the initial mesh in the finite element models of the parts to be assembled. The influence coefficients are then computed on the basis of these updated stiffness matrices. Thus, an analysis step (542) defined whether the application of a displacement and/or of loads tangentially to the assembly interface and necessary, and if such a configuration is necessary, a step (544) of updating the rigidity matrices is carried out before undertaking the computation of the influence coefficients.

According to one embodiment of the method which is the subject of the invention making it possible to take into account any type of assembly, the operation of placing in coincidence (545) is carried out according to an assembly range (541). This assembly range reflects for example an order of placing of the assembly points in coincidence, or else a prior operation of orienting the parts with respect to one another before placing the assembly points in coincidence. It involves the management of the contacts at the level of the interface, introduced as a consequence of the hyperstatism, of the nonlinear behaviors and of the modification of the stiffnesses subsequent to the distortion of the shape. Thus, the problem can no longer be reduced to a simple linear formulation, the dimension of the optimization problem and the computational resources necessary for the conduct of such an optimization rapidly becoming out of reach of the computation means that may be envisaged from a practical point of view. The invention then consists in conducting the optimization on the basis of influence coefficients determined by a statistical analysis of results of assembly simulations, conducted by considering the manufacturing variability of the parts within a defined interval. This statistical analysis can be conducted on the basis of records of real measurements, but in the case of the method which is the subject of the invention, the objective is to conduct the analysis at the design stage, hence the object of the method is in particular to construct a statistical simulation base which is realistic.

For this purpose, the method comprises a generating step (535). This step takes as input the displacement vector sets a with components $(\Delta x_i, \Delta y_i, \Delta z_i)$ defined in the course of the distortion step (530), which optionally takes as input (531) the value of the Tl defined during a previous linear optimization (550). The generating step (535) constructs parts in a random manner by applying displacements corresponding to the vectors Ui at points Pi such that when the origin of said vector is placed on the point Pi, by combining displacement vectors corresponding to the transverse modes of vibration of the parts in question so as to generate mechanically allowable distortions. In contradistinction to the previous cases where a direct relation between the distortion vectors and the influence coefficients is sought, this embodiment makes it necessary to simulate the assemblies mechanically on the basis of the finite element models of the structural mockups while complying with the assembly range. Thus, in the course of a generating step (535), N assembly digital mockups are generated by displacing the points Pi of the theoretical digital mockup acquired during the initialization step (510) by the sets of vectors Ui generated in a random manner. In practice, N is of the order of 1000.

These displacements of the points, which take the form of a generalized vector $\{U\}$, are carried out with or without elastic return. The N mockups generated correspond to N generalized vectors $\{Un\}$, n lying between 1 and N and are stored in a file (536).

Finally, it is necessary to determine the initial clearances between the parts so as to make said parts coincide at the level of the assembly links.

The simulation of the assembly in this general case, between two parts whose corresponding terms are identified by the suffixes 1 and 2, consists in solving the following equation:

$$\begin{bmatrix} K_1 & 0 & L_1 \\ 0 & K_2 & L_2 \\ L_1 & L_2 & 0 \end{bmatrix} \begin{Bmatrix} U_1 \\ U_2 \\ \lambda \end{Bmatrix} = \begin{Bmatrix} F_1 \\ F_2 \\ d \end{Bmatrix}$$

Where:
$K_1$ and $K_2$ are the updated stiffness matrices, after distortion of the respective meshes, of the two assembled parts;
$L_1$ and $L_2$ are boolean matrices selecting from each model of the parts relevant to the assembly the degrees of freedom subject to boundary conditions or constraints;
$\lambda$ is a vector comprising Lagrange multipliers used in the computation to take the boundary conditions into account and make it possible to carry out the constrained optimization;
$F_1$ and $F_2$ correspond to the loads applied at the nodes;
d is a vector whose components contain the initial clearances between the parts I and II.

The result arising from solving this system consists of vectors which correspond to the displacements to be applied to the nodes of the unassembled, but distorted, models of parts so that said nodes attain their assembly position.

Thus, the digital mockups (536) generated are assembled, in the course of an assembly step (545), by applying to the assembly points successive displacement wrenches representative of the assembly range. For each assembly thus carried out, a scalar parameter D representative of the functional requirement is estimated at each of the interface assembly points and for each of the cases of assembly. Thus, each case of assembly is characterized by a parameter Dmax corresponding to the maximum discrepancy noted over all the points of the interface between the nominal of the functional requirement and the value of the parameter D. The scalar D can be of any nature, measurable on the basis of the finite element simulation: distance, force, stress or strain without this list being limiting, and thus reflect various types of functional requirements, including requirements that are unverifiable in a real production situation, such as a constraint level. Several parameters D corresponding to several types of functional requirements can thus be determined for each case of assembly.

Advantageously a cost function can be associated with each parameter D so as to weight the discrepancy Dmax and create a variable of interest.

All these steps (530, 535, 545) proceed in an automatic manner. The optimization is carried out on a results file (546) generated on completion of the assembly simulation step (545). The optimization step (555) is carried out by identifying the influence coefficients by a so-called Monte Carlo method on the basis of said results file (546).

The results file (546) therefore contains a mapping of the values Dmax as a function of generalized vectors {Un} of initial defects for a given range. The steps can be rerun for other input data, such as another range or another initial positioning so that the statistical optimization pertains to these parameters also.

The optimization sequences terminate with the display of the value ||U|| corresponding to the allowable maximum value for the norm of the generalized distortion vector in compliance with Dmax <$D_{all}$, $D_{all}$ being the functional requirement corresponding to the parameter D studied. This value of ||U|| is then displayed (560) and can serve as recommendation as value Tl for the manufacture of the parts studied.

The description and the exemplary embodiments hereinabove clearly show the appropriateness of the invention to the objectives envisaged in particular, and the method which is the subject of the invention makes it possible to define, at the design stage, an optimal tolerancing of flexible parts as a function of their assembly range and functional requirements envisaged.

The invention claimed is:

1. A method for determining an optimal production tolerance for producing a first part to be assembled with a second part according to interface surfaces and in compliance with an assembly functional requirement, the first and second parts being represented by their structural digital mockups, the method comprising the steps of:
acquiring a nominal theoretical position of a plurality of assembly points on the interface surfaces of the digital mockups of the first and second parts;
acquiring a nominal theoretical position of a plurality of structure points distributed over the interface surfaces of the digital mockups of the first and second parts;
acquiring, for the plurality of assembly points and the plurality of structure points of the digital mockups of the first and second parts, a mechanical restoring stiffness for returning the first and second parts to their initial position in the form of a rigidity matrix;
acquiring a variable of interest, comprising a scalar variable representative of the assembly functional requirement and a cost function defining a value of the variable of interest as a function of the discrepancy of the scalar variable with respect to a nominal of the assembly functional requirement;
acquiring a set of distortion vectors of the digital mockups of the first and second parts, said distortion vectors being normal to the interfaces surfaces of the digital mockups;
computing influence coefficients linearly relating each distortion vector to the value of the variable of interest when the digital mockup of the first part, distorted by said each distortion vector, is assembled with the digital mockup of the second part;
simulating the assembly of the first and second parts by placing the assembly points of the two digital mockups in coincidence to provide an optimal production tolerance for the first and second parts in compliance with the assembly functional requirement;
selecting positioning devices and assembly tools to assemble the first and second parts manufactured in accordance with the optimal production tolerance for the first and second parts; and
assembling the first and second parts, manufactured in accordance with the optimal production tolerance for the first and second parts, using the selected positioning devices and the selected assembly tools.

2. The method as claimed in claim 1, further comprising the step of reproducing natural modes of transverse vibrations of the first part by combining distortion vectors.

3. The method as claimed in claim 1, wherein the assembly points of the two digital mockups exhibit discrepancies tangential to assembly surfaces, and further comprising the step of updating the rigidity matrix of the digital mockups deformed during a simulation of the assembly of the first and second parts.

4. The method as claimed in claim 1, further comprising the steps of:
acquiring an assembly range for the digital mockups;
generating a plurality of first and second digital mockups distorted by combinations of distortion vectors;
performing assemblies of said plurality of first and second digital mockups according to the assembly range;
determining an influence variable for each performed assembly; and
performing the step of computing the influence coefficients by a Monte Carlo method based on the influence variable.

5. The method as claimed in claim 1, further comprising the steps of:
acquiring an initial positioning system and an initial stressing system for the digital mockups; and
computing a displacement of the assembly and structure points of the digital mockups subjected to the initial stressing system from their initial positions in the initial positioning system.

6. The method as claimed in claim 5, further comprising the steps of modifying the initial positioning system or the initial stressing system; and repeating the step of computing the influence coefficients with new initial conditions.

7. The method as claimed in claim 4, further comprising the step of modifying the assembly range and repeating the step of performing assemblies of said plurality of first and second digital mockups.

8. The method as claimed in claim 1, wherein the structure points and the assembly points of the first part are nodes of a mesh; and further comprising the step of computing the mechanical restoring stiffness by a finite element model using the mesh.

9. The method as claimed in claim 5, wherein the initial stressing system is gravity.

* * * * *